United States Patent [19]

Negrerie et al.

[11] Patent Number: 5,674,373
[45] Date of Patent: Oct. 7, 1997

[54] METHOD FOR METALLIZING NON-CONDUCTIVE SUBSTRATES

[75] Inventors: Marcel Negrerie, Cormeilles en Parisis; Guy de Hollain, Vernouillet; Van Huu N'Guyen, Cergy St Christophe; Serge Insenga, Mery-sur-Oise, all of France

[73] Assignee: Trefimetaux, Courbevoie, France

[21] Appl. No.: 571,977

[22] PCT Filed: Jul. 11, 1994

[86] PCT No.: PCT/FR94/00860

§ 371 Date: Apr. 12, 1996

§ 102(e) Date: Apr. 12, 1996

[87] PCT Pub. No.: WO95/02715

PCT Pub. Date: Jan. 26, 1995

[30] Foreign Application Priority Data

Jul. 16, 1993 [FR] France .................. 93 08986

[51] Int. Cl.[6] .................. C25D 5/54; C25D 5/56; C23C 28/02
[52] U.S. Cl. .................. 205/160; 205/161; 205/162; 205/163; 205/164; 205/165; 205/166; 205/167; 205/182; 205/186; 205/187

[58] Field of Search .................. 205/158, 160, 205/161, 162, 163, 164, 165, 166, 167, 169, 182, 186, 187

[56] References Cited

U.S. PATENT DOCUMENTS 2,893,930  7/1959  Sheheen .................. 205/162
5,389,270  2/1995  Thorn et al. .................. 252/22

FOREIGN PATENT DOCUMENTS 927205  5/1963  United Kingdom.

Primary Examiner—Kathryn L. Gorgos
Assistant Examiner—Edna Wong
Attorney, Agent, or Firm—Oblon, Spivak, McClelland, Maier & Neustadt, P.C.

[57] ABSTRACT

A method comprising the steps of (a) preparing a divided copper oxide dispersion (4) including a solvent and a selected binder, (b) applying said dispersion to a non-conductive substrate (1) to form a film (5), (c) forming a Cu film (9) with a suitable reagent, and (d) electrolytically depositing at least one metal film (11) on said film (9).

26 Claims, 5 Drawing Sheets

METHOD FOR METALLIZING NON-CONDUCTIVE SUBSTRATES

This is a national stage application of PCT/FR94100860 filed Jul. 11, 1994

FIELD OF THE INVENTION

The invention relates to a process for metallizing nonconductive substrates.

PRIOR ART

Numerous processes are already known for forming a metallic layer on a nonconductive substrate or support, whether this pertains to glass, plastic materials, composite materials with a nonconductive matrix, paper, ceramic materials, etc.

A first family of processes calls for the deposition by evaporation under vacuum of liquid metal thanks to various means of heating (Joule effect, electron bombardment, cathode sputtering, etc.). Thus, it is possible to deposit a layer of aluminum on films typically made of plastic material (PET, for example).

As variants of these processes, one finds the processes of deposition chemically known under the term "CVD" (chemical vapor deposition), possibly with the help of a plasma (PEVD processes=Plasma Enhanced Vapor Deposition).

The processes of chemical or electrochemical deposition of metals are also known.

These processes are considered conventional in the case of conductive supports.

In the case of nonconductive supports, a preliminary treatment is necessary before proceeding with the actual chemical or electrochemical deposition.

This treatment can be metallization under vacuum, as described in the patent FR-A1-2 558 485 relating to the manufacturing of a porous metallic structure.

This treatment can also be an activation treatment based on precious metals (silver, palladium, gold), as described in the work "Electroplating of Plastics—J. Christof et al.—Finishing Publications Ltd. 1977 UK," or else in the work "Surface Finishing Systems: Metal and Nonmetal Finishing Handbook-Guide—by George J. Rudzki—Finishing Publications Ltd. 1983—England."

The typical process includes the sequence of the following steps:

etching of the substrate with chromic acid;

treatment with a stannous chloride solution;

treatment with a solution containing a precious metal such as Ag, Pd, Au;

immersion in a bath called "electroless" (chemical deposition, or autocatalytic [deposition]) allowing one to deposit metals such as silver, copper, nickel, or tin (relatively slow deposition);

finally, electrolytic covering with the metal to be deposited (much more rapid deposition than the chemical deposition—necessary step for obtaining a conductive surface). Finally, there are processes in which the preliminary treatment, necessary for the implementation of conventional chemical or electrochemical depositions (respectively, reduction of a metallic salt chemically, using a reducing agent, or electrochemically), consists of incorporating in the substrate conductive fillers such as conductive flakes or powders (metallic powders, fibers of carbon, graphite, etc.), or fillers made conductive by reduction.

Thus, French application FR-A-2 544 340 describes a process for manufacturing a conductive film which includes the following steps:

one forms a collodion of a heat-hardening resin containing 20 to 60 wt % $Cu_2O$ in powder form;

one forms a film from this collodion;

one draws the film or mechanically pickles it in order to expose on the surface (bring to light) particles of $Cu_2O$;

one reduces the particles of $Cu_2O$ on the surface by borohydride;

then, one carries out an electrolytic deposition.

Likewise, in the French application FR-A-2 518 126, a process is described for metallizing a molded object by electrolytic deposition, which includes the following steps (Example 1).

formation of a mixture of prepolymer material and $Cu_2O$ powder;

molding of the mixture in order to obtain said object and crosslinking of the prepolymer material;

treatment of the surfaces of said object with a gentle abrasive, dust removal, and treatment in an ultrasound tank, in order to expose the particles of $Cu_2O$;

formation of copper by reduction of $Cu_2O$ with borohydride;

then, electrolytic deposition of copper.

There are also known processes which allow one to carry out an electroless metallic deposition without the need for an activation treatment using a precious metal.

Thus, U.S. Pat. Nos. 3,146,125 and 3,226,256 disclose processes which typically include the following steps:

preparation of a mixture of prepolymer and $Cu_2O$ powder;

molding of this mixture, or application of this mixture in the manner of an ink on an insulating support;

crosslinking of this mixture;

possible abrasion of the surface in order to expose the $Cu_2O$ particles;

dismutation of $Cu_2O$ by sulfuric acid;

then, electroless metallic deposition.

Finally, there are known processes, as described in U.S. Pat. No. 4,327,125, in which one deposits on the nonconductive surface to be copper-plated a colloid of Cu particles, formed from a copper salt and a reducing agent; then, one performs a chemical deposition of copper in an electroless bath.

Purposes of the Invention

The purpose of the invention is a treatment of any nonconductive surface, of any shape, allowing one then to carry out a metallization, not only by electroless deposition, but above all by electrolytic deposition, which is advantageous from an economic standpoint, given the high rate of deposition of the electrolytic method.

DESCRIPTION OF THE INVENTION

The invention can be implemented according to two practical modes.

According to a first mode of the invention, the process for manufacturing a continuous metallic deposit on a nonconductive substrate includes the following steps:

a) one prepares a dispersion of copper oxide in the divided state, which is capable of being transformed, at least in part, to the state of metallic copper by the action of a reagent, which contains a solvent and a binder selected to form, after elimination of the solvent, a film that is permeable to said reagent;

b) one applies said dispersion on said nonconductive substrate, and one forms a thin layer on said nonconductive substrate which contains said copper oxide in the divided state, with a thickness of less than 30 µm;

c) one forms Cu from said copper oxide by the action of said reagent, so as to obtain, on the surface of the nonconductive substrate, a thin layer containing Cu;

d) one deposits, on said layer containing Cu, at least one metallic layer by electrolytic deposition of at least one ionic metallic species in solution.

Thus in comparison with prior art, the invention constitutes a simpler and more economical process: it is sufficient, on the one hand, to produce a dispersion of copper oxide, which is obtained from commercial products, and to apply, with no special means, as a paint, an ink or a varnish, on any nonconductive substrate, which is most often, but not necessarily, in its final form, and on the other hand, to transform all or part of this oxide into Cu, in a manner known in itself, before producing a metallic deposit by electrolytic deposition.

Certainly, the use of $Cu_2O$ was already known in metallizing treatments of prior art for the purpose of allowing for subsequent electrolytic deposition, but under completely different conditions, since in the application FR-A-2 518 126, the $Cu_2O$ is not deposited on the surface but intimately bound with the nonconductive substrate itself, the latter being molded in the presence of $Cu_2O$. The surface of the molded object obtained is then abraded in order to allow for the action of a borohydride as agent for reducing $Cu_2O$, in such a way as to obtain a high degree of electrical conductivity.

Such a process would therefore not be applicable, according to the invention, to any substrate such as a porous foam, with an interior surface of the pores which is inaccessible to abrasive action.

The present invention offers a particularly surprising characteristic insofar as in spite of the fact that by steps a) to c), one forms a thin layer containing little copper and which is therefore not very conductive, it is possible according to the invention then to form a metallic layer by electrolytic deposition.

Whereas the surface resistivity obtained after the treatment described in the French application FR 2 518 126 is between 0.01 and 1000 Ω/square, that obtained after steps a) to c) according to the present invention is at a much higher level which can reach $20 \times 10^6$ Ω/square or a resistivity that is 20,000 times higher than that indicated in the application FR 2 518 126.

Furthermore, the studies undertaken by the applicant have shown that the possibilities for performing a metal deposition electrolytically are not correlated with this criterion of resistivity, contrary to what the study of prior art could allow one to assume. See Example 3.

In contrast, these studies have shown that the nature and the state of the binder (crosslinked or not) play a decisive part, as illustrated in Examples 5 and 6.

DESCRIPTION OF THE FIGURES

All the figures relate to the invention.

Figure 1:
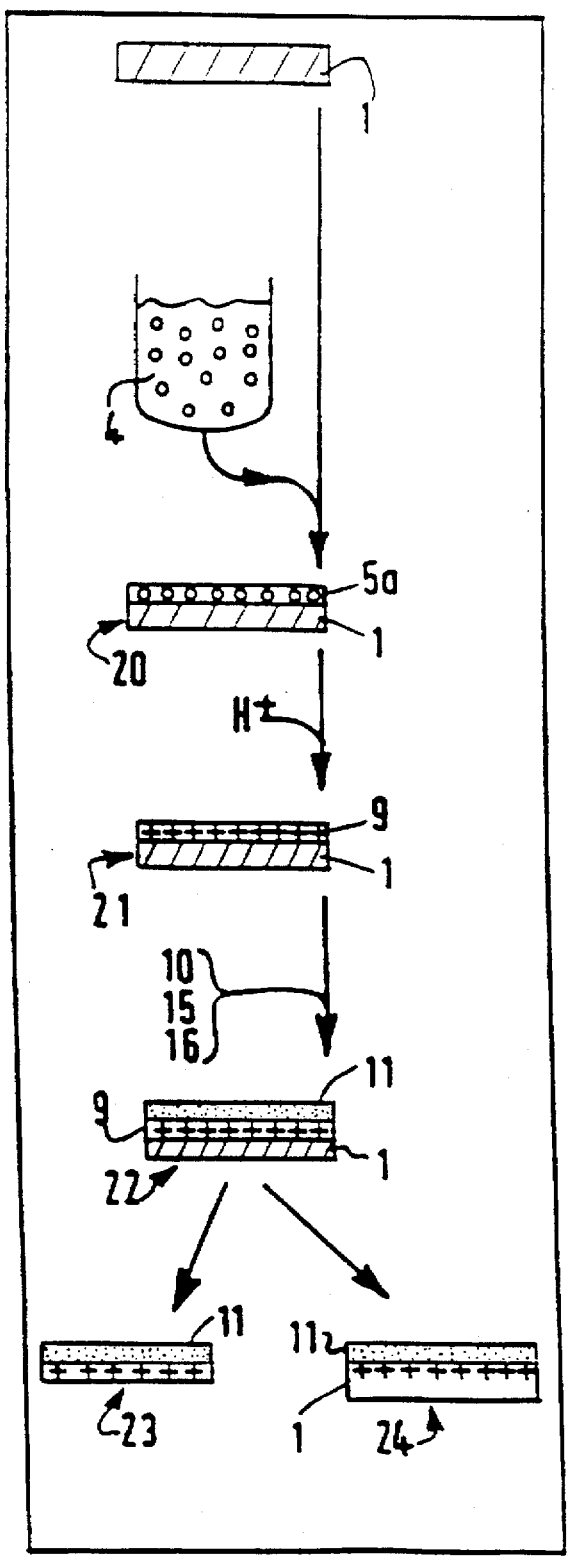
FIGS. 1 to 3 illustrate the different steps of the process according to different variants relating either to the nature of nonconductive substrate (1) (material with apparent porosity in FIG. 1; cellular material with apparent porosity in FIG. 2), or to the nature of the dispersion applied on this substrate (1) (dispersion (4) containing $Cu_2O$ powder in FIGS. 1 and 2; dispersion (4a) containing a conductive powder in FIG. 3).

In the process represented in FIG. 1, substrate (1) is coated on one surface with dispersion (4), in a solvent medium, of $Cu_2O$ powder (represented by small circles) and binder according to the invention, in such a way as to obtain, after elimination of said solvent by drying, multilayer material (20) formed by support (1) covered with thin layer (5a) containing $Cu_2O$ and the binder according to the invention. After immersion in an acid solution, one obtains multilayer material (21) formed by support (1) covered with thin layer (9) containing conductive particles (Cu) (represented by crosses). After electrolytic deposition of metal in electrolysis bath (10), provided with cathode (15) and anode (16), one obtains multilayer material (22) which has metallic layer (11) with the desired thickness.

This multilayer material can then also be transformed, either by separating the substrate in such a way as to obtain essentially metallic material (23), or by heat-treating material (22) in such a way as to obtain material (24) by crosslinking said binder and thus solidly connecting said substrate (1) and said metallic layer (11).

Figure 2:
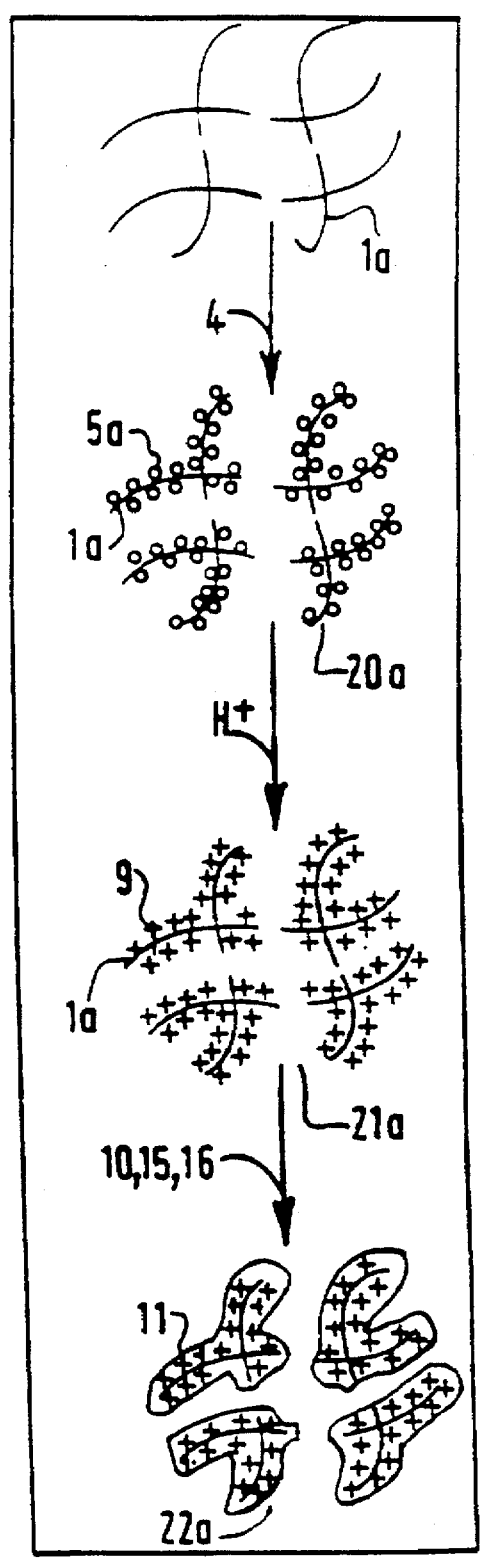

In FIG. 2, which differs from FIG. 1 by the nature of the substrate, the process of the invention has been applied to foam (1a) with apparent porosity (diagrammed by the representation of a pore in cross section). By immersion of the foam in dispersion (4) and then removal and drying, one obtains material (20a) in which the whole surface of the pores is covered with layer (5a) which contains $Cu_2O$ and the binder according to the invention.

By acid treatment, one forms material (21a) in which the surface of the pores is covered with layer (9) containing conductive particles (Cu) and said binder. Then, by electrolytic deposition, one obtains material (22a) of which the whole surface of the pores is covered with metallic layer (11).

Figure 3:
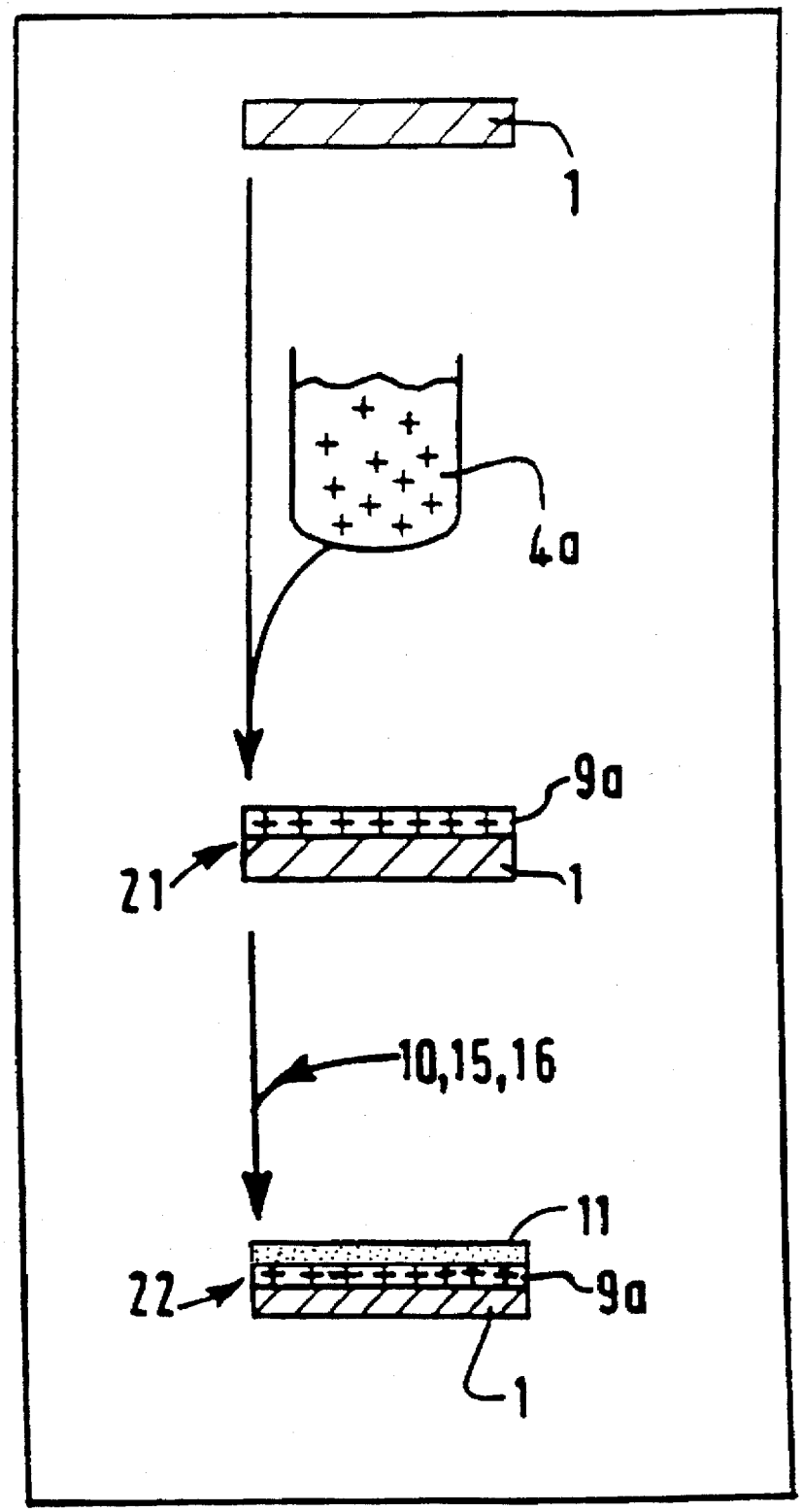

In FIG. 3, similar to FIG. 1, dispersion (4a) contains conductive particles, instead of containing $Cu_2O$ as in dispersion (4) of FIG. 1. After application of a thin film of this dispersion and drying, one obtains materials (21) which have layer (9a) of conductive particles in said binder.

Figure 4:
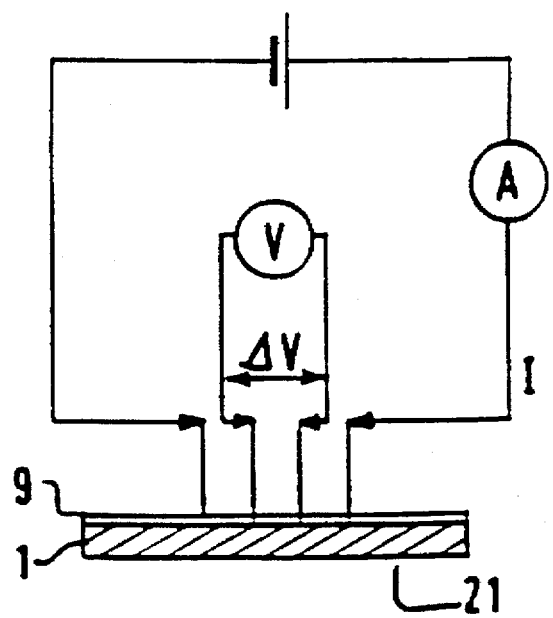

FIG. 4 represents the electrical assembly allowing one to determine the surface resistivity of materials (9,9a).

This resistivity (Ω/square) is given by the formula: ($3.14 \times \Delta V / I \times \ln 2$), the measuring electrodes being 25 mm apart.

Figures 5A, 5B:
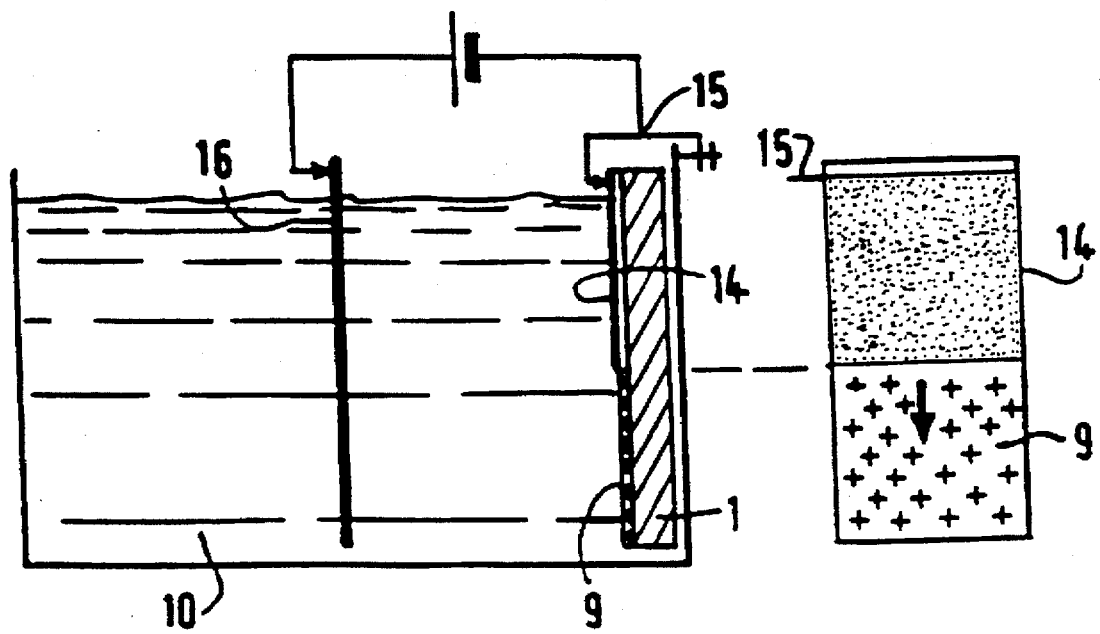
Figure 6:
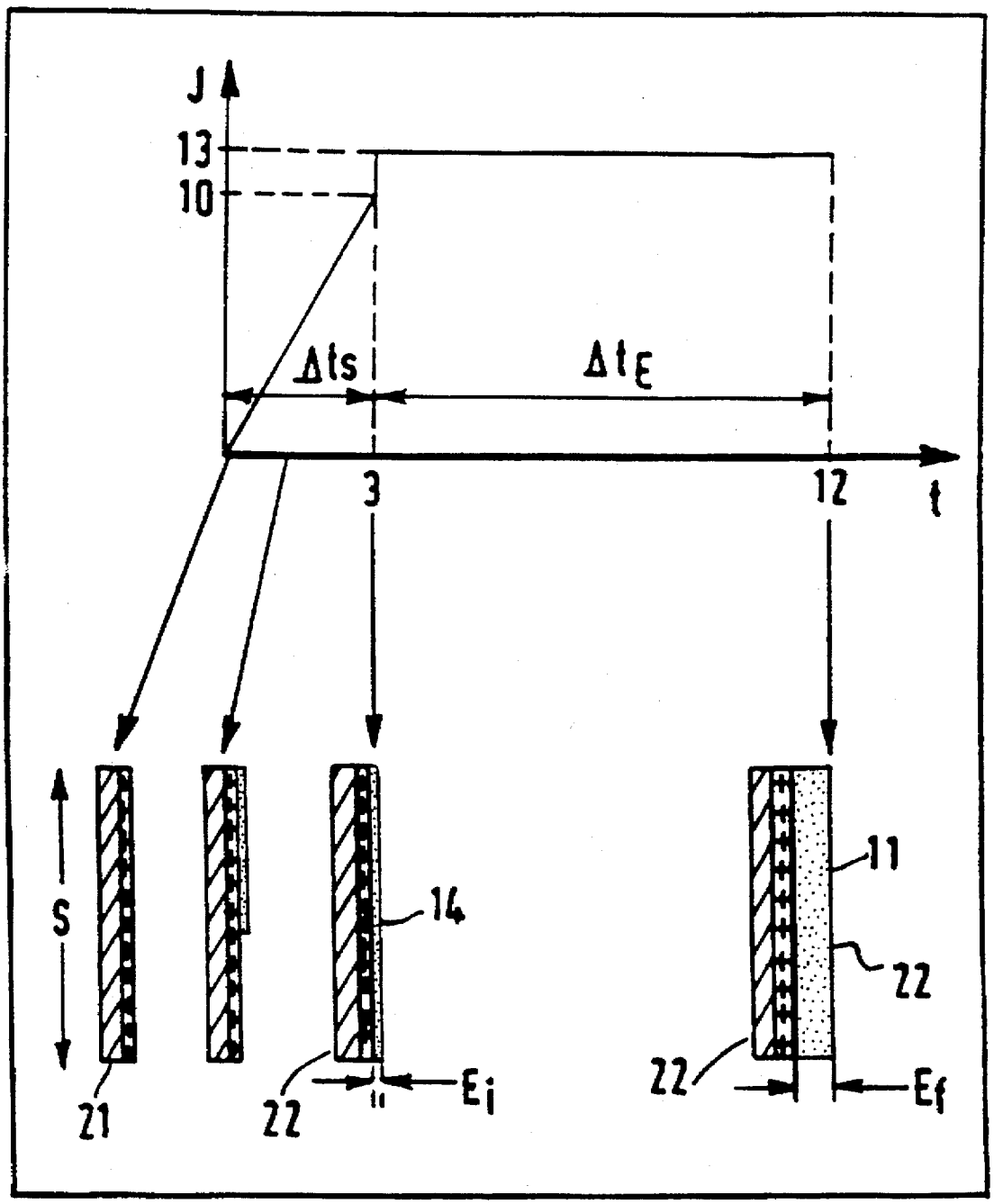

FIGS. 5, 5a, and 6 illustrate in cross section a preferred manner of forming metallic layer (11) by electrolysis, in bath (10), the transport of the current being ensured by cathode (15) and anode (16):

One first forms "primary" metallic film (14) by growth of the metallic film from the point of electrical contact with layer (9), so as to cover progressively the whole surface of layer (9).

FIG. 5a represents a front view in which metallic film (14) covers approximately half the surface of layer (9) and progresses towards the bottom in the direction of the arrow, the point of electrical contact with layer (9) having been placed at the upper end of layer (9).

Then, once the metallic film is formed over the whole surface S of layer (9), the electrolysis is carried out in order to increase the thickness of metallic film (14) and to obtain metallic layer (11).

FIG. 6 diagrams in a graph J=f(t) in which J, on the y axis, represents the intensity of the current in A, the surface area in this case being 1 $dm^2$, and in which t, on the x axis, represents the time in min of the two electrolysis steps:

The first step, whose duration is noted $\Delta t_s$, aims to progressively cover the whole surface S of layer (9) with metallic film (14) with thickness Ei, which takes place with a progressive increase of the current density.

The second step, whose total duration is noted $\Delta t_e$, aims to increase the thickness of the metallic layer, which goes from the initial thickness $E_i$ to the thickness $E_f$ in final metallic layer (11).

Figure 7:
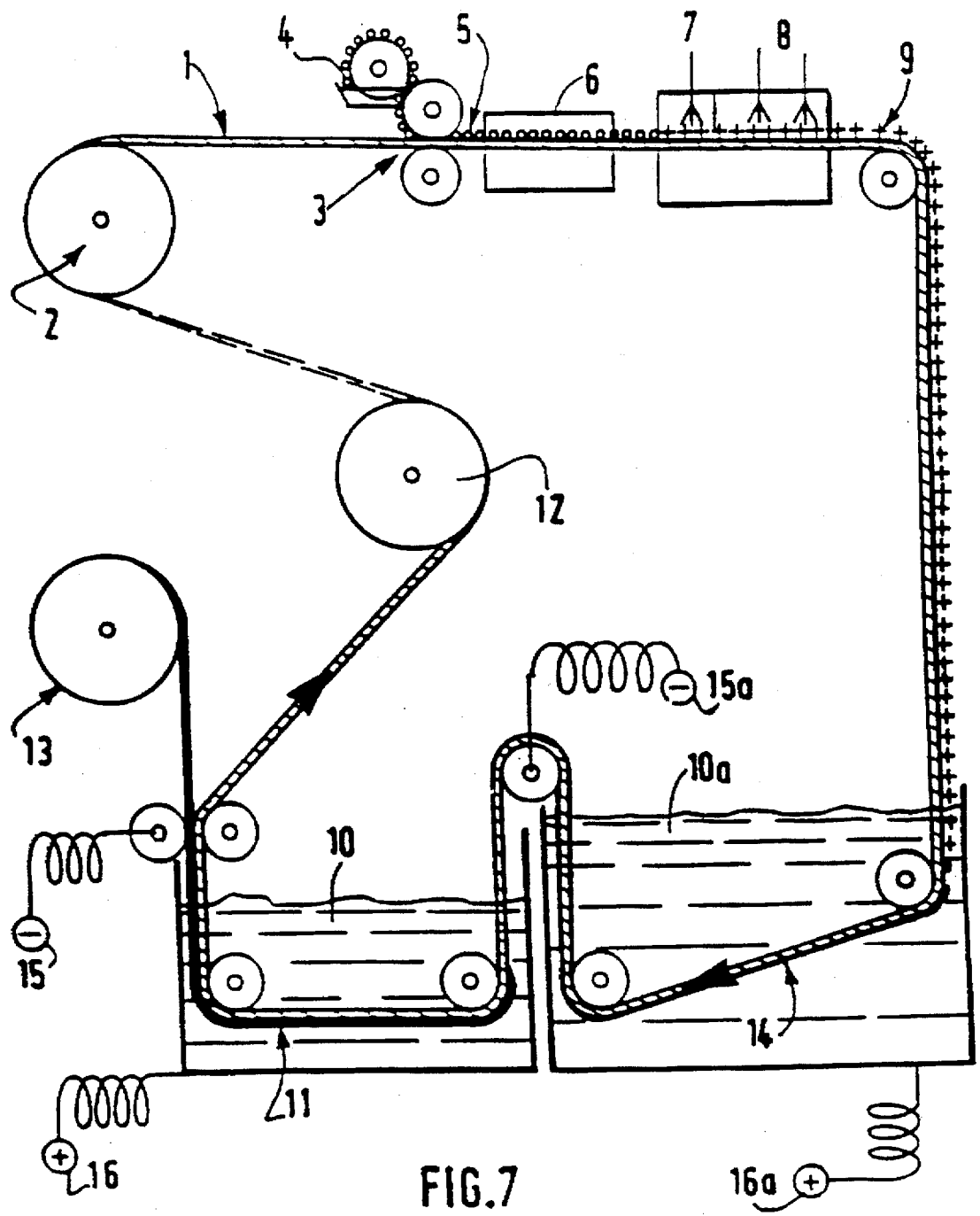

FIG. 7 represents, in cross section, the diagram of an electrolytic deposition installation for implementation of a mode of the invention aiming to continuously produce metallic strip (13). This diagram makes it possible to illustrate the process according to one mode of the invention.

Substrate (1) is a plastic film in wound form (represented by a strip hatched laterally).

The installation successively includes:

means (2) of supplying substrate (1);

means (3) for applying on substrate (1), thin layer (5) (represented by circles) of dispersion (4) of $Cu_2O$ in a solvent;

means (6) of drying said thin layer (5);

means (7) of washing said thin layer (5) with acid and means of rinsing (8) with water, leading to the formation of said thin layer (9) which contains Cu (represented by crosses);

means ensuring the electrolytic deposition of metallic layer (11) in two successive baths:

In the first (10a), the metallic salt concentration and the electrical parameters, current voltage between cathode (15) and anode (16a) and intensity, are chosen so as to obtain, leaving the bath, a metallic film with a thickness $E_i$ of a few μm.

In second bath (10), the intensity of the current running through cathode (15) and anode (16) is greater than that in the first bath, and it is suitable for the rapid formation of metallic layer (11) with the desired thickness $E_f$.

Leaving the electrolysis bath, the plastic strip serving as support (1) is separated from metallic strip (13). The plastic strip is possibly reintroduced at the top of the device, thanks to guiding means (12).

DETAILED DESCRIPTION OF THE INVENTION

For the implementation of the first mode of the invention, it is possible to choose, as copper oxide, either CuO or $Cu_2O$, said reagent being a reducing agent in the case of CuO, and said reagent being either a reducing agent or a dismutation agent in the case of $Cu_2O$.

Said dispersion (4) of CuO or $Cu_2O$ in a solvent, prepared in step a) of the process, contains a fine dispersion of CuO or $Cu_2O$ in the form of particles whose average size is less than 30 μm, preferably less than 10 μm, and greater than 0.1 μm.

The CuO or $Cu_2O$ content in said dispersion (4) is between 20 and 80%.

If one wishes to obtain a fluid dispersion, the $Cu_2O$ or CuO content in said dispersion will generally be between 20 and 60 wt %, but in other respects, the viscosity, which increases with the $Cu_2O$ or CuO content, also depends on the other constituents of the dispersion.

The formation of Cu from $Cu_2O$ can be brought about according to two conventional methods, by action of a reducing agent or by dismutation.

The dismutation (disproportionation in English) of $Cu_2O$ is in itself a known reaction which can be written (balanced reaction):

$$2Cu^+ \longleftrightarrow Cu^{++} + Cu$$

It is advantageous according to the invention to choose the reaction of $Cu_2O$ dismutation and preferably to choose, as reagent, a dismutation agent which is an acid for the following reasons:

on one hand, the action of an acid on said thin layer containing $Cu_2O$ is more rapid than that of a reducing agent: the mobility (the ease of penetration into said layer) of the $H^+$ ions is much greater than that of a reducing agent such as a borohydride. Hence, the possibility for continuous treatment.

on the other hand, according to a hypothesis of the applicant, it is possible that the penetration of the acid into said thin layer containing $Cu_2O$ and the dismutation reaction itself leads, by formation of a $Cu^{++}$ ion which is soluble in aqueous medium, to a porosity in said thin layer containing Cu which greatly improves the electrolytic contact between the metallic Cu deposit of said thin layer containing Cu and the whole metallic ion solution to be deposited.

finally, ordinary acids are much more economical than the reducing agents such as the borohydrides.

Furthermore, in should be emphasized that, as demonstrated after measurements of surface resistivity done in the context of the research of the applicant, a surface with a low resistivity no longer seems to be a necessity for being able to carry out subsequently and directly an electrolytic deposition. According to the invention, it is not necessary to attempt to increase the quantity of conductive particles, since a surface resistivity, which can be as high as $40 \times 10^6$ Ω/square is sufficient to obtain the primary technical effect which allows for subsequent electrolytic deposition.

In the case of dismutation of $Cu_2O$ using acid, one preferably operates with a dilute acid in aqueous solution.

Said acid is chosen from the group formed by acetic, formic, nitric, oxalic, phosphoric, sulfamic, sulfuric, and tartaric acids. Sulfuric acid is preferably used.

This dismutation reaction, which leads to the formation of thin layer (9) containing Cu, is generally carried out after drying and elimination of the volatile materials from thin layer (5). However, it is important, according to the invention, for the drying to be done under conditions, particularly of temperature, which preserve the permeability of the binder with regard to said reagent. In effect, it is therefore necessary to avoid drying temperatures which would lead to polymerization or extensive crosslinking of said reagent.

It has been observed, on one hand, that the dismutation reaction is very rapid, on the order of a few seconds, typically 5 to 20 sec, and on the other hand, that the thin layers, layers (5a) and then (9), keep their integrity and do not disintegrate during the drying, during the phase of washing with acid and of rinsing with water, which is essential for the implementation of the invention. These are two essential criteria in the choice of a binder and of the conditions of formation of thin layers (5a) and (9).

According to the invention, it is also possible to carry out the reaction of $Cu_2O$ with a salt, preferably a water-soluble sulfide ($K_2S$, for example). In this case, a black layer forms, on which it is possible to carry out an electrolytic deposition.

The second practical mode of the invention as already mentioned calls for the use of conductive particles. In this case, the process according to the invention includes the following steps:

a) one prepares dispersion (4a) of an electrically conductive powder, in the divided state, which contains a solvent and a selected binder;

b) one applies said dispersion (4a) on said nonconductive substrate (1), and one forms thin layer (9a) on said nonconductive substrate which contains said conductive powder in the divided state;

c) one deposits on said layer (9a) a metallic layer by electrolytic reduction of at least one ionic metallic species in solution.

But it should be noted that if the use of electrically conductive particles is necessary, obtaining of a conductive surface or of a surface with a low resistivity, typically less than 1000 Ω/square, is not necessary according to the invention in order to be able subsequently and directly to carry out an electrolytic deposition; in effect, a resistivity which can reach $40 \times 10^6$ Ω/square is suitable according to the invention, which allows one to use small quantities of conductive powders or slightly less conductive powders but in a greater quantity.

Said conductive powder is preferably a graphite powder with a particle size of less than 50 μm, but any conductive powder, such as a metallic powder, for example, could be suitable, provided that a metal that is not very oxidizable is chosen.

Preferably, said graphite powder is in the form of flakes 1 to 3 μm thick and in which the largest dimension is 5 to 20 μm.

Regardless of the mode of implementation of the invention, said fluid dispersion (4,4a) can be applied on said nonconductive substrate (1) by coating, dipping, slip painting, spraying or any other method which is known particularly in the techniques of printing (silk screen process, flexographic printing, etc.) or the techniques of painting, including industrial painting, for applying a fluid dispersion in the form of a thin layer and with a regular thickness on a substrate, and typically with a thickness of less than 30 μm.

Regardless of the mode of the invention, said binder plays roughly the same part, whether it is a matter of layer (9) containing particles of Cu or of layer (9a) containing conductive particles.

The invention allows one, in step b) of the process, to apply said dispersion (4) on said nonconductive substrate (1) using a mask, typically by silk screen process, so as to obtain, after step d) of the process, conductive metallic tracks, preferably made of copper.

In general, dispersion (4,4a), so that it can be applied on substrate (1), must have sufficient fluidity, which can vary depending on the chosen technique of application. In contrast, once this dispersion is deposited in a thin layer on the substrate, it is often desirable to set this dispersion, by any known method for setting a dispersion, and typically by evaporating said solvent, or by flocculating said binder, or by applying said dispersion with heat (in the fluid state) and then cooling it in order to increase greatly the viscosity, in which case elimination of the solvent may not be necessary.

The act of setting the dispersion amounts to increasing its cohesion, and most often the adherence of the substrate, which allows for easy handling of the covered substrate and treatment by said reagent, if necessary.

After having formed, directly or not, layer (9,9a) containing conductive particles, one proceeds with the electrolytic deposition of metal.

According to the invention, the electrolytic deposition of said metallic species is preferably carried out, in one or more electrolysis baths, in two steps:

in a first step, one produces a "primary" metallic deposit on the surface treated according to the invention (either after steps a), b) and c) forming layer (9) in the case in which a dispersion (4) of $Cu_2O$ is used, or after steps a) and b) forming layer (9a) in the case in which dispersion (4a) of conductive powder is used), by growth and propagation, from at least one point of electrical contact on said treated surface, of a metallic film until, by advance of the growth front of said metallic film, said "primary" metallic film (14) covers said treated surface, the thickness of said "primary" metallic film (14) being small and typically less than 10 μm;

in a second step, the thickness $E_i$ of said "primary" metallic film is increased until the desired thickness $E_f$ for said metallic layer (11) is obtained.

In said first step, one obtains said "primary" metallic film (14) by progressively increasing the intensity J or the density I of the electrolysis current until obtaining a maximum intensity $J_{max}$ (or density $I_{max}$) which typically but not necessarily will be that used during said second step, and by limiting the stirring of said electrolysis bath. In practice, one multiplies the points of contact in order to reduce the time of formation ($\Delta t_s$) of "primary" metallic film (14).

Instead of increasing the current density, it is also possible to use increasing pulsating currents, or also to set the deposition voltage and allow the current to drift, which will then proportionally increase the metallized surface area.

In the case of a progressive increase of the density or intensity ($dI_{max}/dt$), this is chosen to be as high as possible but below a limit value which can be determined experimentally ($dI_{max}/dt)_{max}$ and beyond which stopping of the growth in and of the propagation of said metallic film (14) takes place before the whole of said treated surface is covered with said metallic film.

In effect, the applicant has observed that an excessive increase of the intensity leads to a sudden stopping of the growth in the surface of the metallic film (14). Detailed examination of the phenomenon has shown that when the current density is excessive, "burned" deposits form, which is to say that at the growth front of said metallic film, metallic hydroxides become incorporated in said film and disturb its growth.

In the case of continuous metallization, two successive electrolysis tanks are used, as represented in FIG. 7. Besides the metallic salt concentration and the suitable choice of the electrical parameters (intensity and voltage), the inclined arrangement of support strip (1) with respect to the metallic tank serving as anode can contribute to the progressive formation of metallic film (14) in first electrolysis bath (10a) by progressive increase of the electrical field as the strip advances in bath (10a).

In the case in which bath (10a) has only one point of electrical contact by cathode (15a), the speed of advance of the strip is adjusted based on the speed of growth and propagation of the metallic film, which is typically at least a few centimeters per min (typically 3 to 4 cm/min).

According to the invention, said binder has a weight content in said dispersion (4,4a) of less than 20 wt % and is chosen in such a way as:

1) to obtain, as a function of said solvent (binder which must be soluble or able to be finely dispersed in said solvent), stable dispersion (4,4a) of said copper oxide or of said conductive powder;

2) to form continuous thin layer (5,9a) on said substrate, including after partial or total elimination of said solvent;

3) to form thin layer (9,9a) which keeps its integrity in an electrolysis bath.

The first function of the binder is therefore the ability to form a thin and continuous layer covering the particles which does not disintegrate in contact with water in particular.

The essential second function which the binder must have is its ability to allow for the growth of a metallic film under electrolysis conditions. On one hand, it seems to be difficult if not impossible to correlate this function with an intrinsic property of the binder, and on the other hand, as will later be explained in more detail, this ability depends also on the surface texture of substrate (1) to be treated. For all these reasons, said binder is selected based on a test which includes steps a) to d) of said process which includes the formation of thin layer (9) containing particles of copper, in which the parameters other than those relating to the binder and to its solvent are predetermined:

- in step a), one prepares said dispersion (4) which contains, by weight, 50% $Cu_2O$ and roughly 10% of said binder to be tested and 40% of its solvent;
- in step b), one applies said dispersion (4) on a plate of insulating material (1) to be metallized (10 cm×20 cm×1 cm), a layer (5) 25 μm thick, and one forms thin layer (5a) by eliminating the solvent at a temperature that is sufficiently low not to polymerize or crosslink said binder, in the case of a binder that can be thermally polymerized or crosslinked;
- in step c), one treats said plate covered with the dispersion of $Cu_2O$ using 10 wt % sulfuric acid for 1 min in order to bring about the dismutation of $Cu_2O$ and to form thin layer (9) containing particles of Cu; then one rinses the plate with water;
- in step d), one subjects the plate obtained after step c) to a test of electrolytic deposition of Cu, under the conditions for formation of said "primary" metallic layer (14) with a current gradient, typically as indicated in FIG. 6 in which $\Delta t_s$ equals 3 min and the current intensity J is equal to 10 A.

Said binder is selected if, by growth and propagation of a metallic film, a "primary" metallic film (14) covering said thin layer (9) progressively forms. See Example 3.

In the case in which the tested material is highly divided (foam with apparent porosity), $\Delta t_s$ should be considerably increased in order to reach, for example, 15 min. See Example 4.

The applicant has observed that all the binders selected using a flat substrate (1)0 for example, a plate of plastic material, are not suitable for a substrate (1) consisting of a foam with apparent porosity, whereas all the binders suitable for a porous substrate are also suitable for a nonporous substrate.

According to a hypothesis of the applicant, only the most "flexible" binders are suitable for porous substrates, which have internal surfaces with small radii of curvature or numerous breaks of slopes.

Preferably, said solvent is chosen from the organic solvents, and said binder is preferably chosen from the low-molecular oligomers, prepolymers or polymers with polar groups.

It is possible to choose said binder from thermoplastic resins (cellulose acetate buryrates, acrylic, polyamide, polystyrene, vinyl isobutyl ether, etc. or resins which can be heat-hardened before crosslinking (silicone resins, epoxy resins, phenoxy, polyesters, etc.).

Said binder is preferably chosen from the silicone resins.

These binders can be chosen from the known additives for stabilizing mineral pigments of inks or paints, most often but not exclusively, in an organic solvent medium. These stabilizing agents, of a great chemical variety, are molecules, a part of which has an affinity for the product to be dispersed and the other part of which can have an affinity for the solvent.

These stabilizing agents, which can as well be monomers, oligomers or polymers with a low to medium molecular weight, can be chosen also as a function of substrate (1) and the nature of the product which one wishes to manufacture.

In effect, there are cases in which one wishes to manufacture composite (24), "substrate (1)+metallic layer (11) which sticks to the substrate," and there are cases, as represented in FIG. 7, in which one wishes to manufacture metallic strip (13,23) and in which, contrary to the preceding case, one wishes to be able to separate easly said metallic layer (11) from its substrate (1) in order to obtain metallic strip (13,23).

In the first case, it will be desirable to have an affinity, a compatibility between the chemical nature of the substrate and that of the binder so that a certain connection between substrate (1) and layer (5) occurs during the elimination of the solvent and especially during a treatment of crosslinking of said binder subsequent to the deposition of metal by electrolysis.

In the second case, on the contrary, chemical incompatibility will be desirable.

But in all cases, the selected binder must allow for permeability with regard to said reagent and to said electrolysis bath, and in particular rapid migration of the $H^+$ ions in the case of the preferred process of dismutation of $Cu_2O$, while keeping its physical integrity in the presence of said reagent.

The formulation of said dispersion (4) can also call for various additives (thickening agents, which can be, for example, of the modified cellulose type, aluminosilicates of the montomorillonite type, modified Bentone®, Thixcin®= castor oil derivative), which are known in themselves in the field of paints and inks, particularly in order to suit the rheological properties of the dispersion to the chosen technique of application, or in order to ensure preservation during the time of said dispersion. Generally, these additives are used in a small quantity (typically on the order of 1 wt %).

According to the invention, said nonconductive substrate (1) is chosen from the group formed by the flat materials (plastic films in wound form, fabrics, nonwoven materials, felts preferably in wound form, etc.), the molded materials (molded parts, tubes, etc.), the cellular materials with apparent porosity (foams made of plastic material, felts made of textile material, etc.).

There is no limitation of the invention as to the nature and the more or less divided state of said nonconductive substrate (1) (plastic, ceramic, glass, wood, textile, etc.), except that this substrate (1) must not be destroyed during the implementation of the process according to the invention, whether this is by the solvent of said dispersion or by the water of said electrolysis bath.

Said substrate (1) can be a material in strip form or in formats [sic] and in which the different steps of said manufacturing process can be carried out continuously, as illustrated in FIG. 7 as an example.

After formation of metallic layer (11), the process allows for numerous variants depending on the nature of the desired final material:

After the step of formation of said metallic layer (11), it is possible to separate said metallic layer (11) from said nonconductive substrate (1), preferably by physical separation, pyrolysis or chemical dissolution. One thus obtains essentially metallic material (13,23).

After the step of formation of said metallic layer (11), it is also possible not to separate said metallic layer (11) from said nonconductive substrate (1), and possibly to reinforce the adherence between said nonconductive substrate (1) and said metallic layer (11) by polymerizing or crosslinking said binder after formation of said metallic layer (11).

EXAMPLE 1

Using a ball mill, one prepares dispersion (4) with the following weight composition:

$Cu_2O$: 50% binder or stabilizing agent: 10% solvent: 40%

The $Cu_2O$ is a commercial powder, which after crushing, has an average particle size on the order of 2 μm. The binder (stabilizing agent) is a commercial methylphenylsilicone resin, and the solvent is trichloroethylene.

The substrate is a piece of polyurethane foam 10 mm thick, with apparent pores (pores 0.8 to 1 mm).

The substrate was dipped in dispersion (4) and then, after it had been withdrawn and drained, it was dried in dry air for one min.

It was then dipped for some ten seconds in a 10% sulfuric acid solution and then rinsed with water.

This substrate was placed in a conventional electrolysis bath containing 80 g/L of $CuSO_4$, and it was connected to the negative pole of a current generator. This substrate was subjected to electrolysis with a current density I equal to 3 $A/dm^2$, for a duration of 20 min, in such a way as to obtain metallic copper film (14) with an average thickness on the order of 10 μm.

EXAMPLE 2

This example is similar to Example 1, except that the reagent is not sulfuric acid but a 3 wt % potassium sulfide aqueous solution.

One thus obtained a conductive black deposit which allows one to obtain a copper deposit by electrolysis of a copper salt.

EXAMPLE 3

In this example, 11 different binders were tested.

A) Preparation of the dispersions of $Cu_2O$ by crushing, as in Example 1, of $Cu_2O$ powder (50 wt % of the dispersion), in trichloroethylene as solvent, in the presence of binder.

The table which follows indicates the nature of the binder and the weight percentage of binder and of solvent in the dispersion.

| Binder<br>Chemical nature/Commercial name | wt % | Solvent<br>wt % |
| --- | --- | --- |
| 1) Polymethylphenylsilicone/NH2246 (R) | 10 | 40 |
| 2) Polymethylphenylsilicone/Rhodorsil 1505 (R) | 10 | 40 |
| 3) Polymethylphenylsilicone/REN50 (R) | 10 | 40 |
| 4) Polymethylphenylsilicone/Rhodorsyl 6405 | 10 | 40 |
| 5) Silicone/SR125 (R) | 10 | 40 |
| 6) Silicone/Dow Corning 808 (R) | 10 | 40 |
| 7) Polymethacrylate/Altuglas (R) | 10 | 40 |
| 8) Acrylic/Perlucid Re2600 (R) | 10 | 40 |
| 9) Epoxide/Duralit R-1516 (R) | 10 | 40 |
| 10) Polystyrene (from commercial expanded polystyrene) | 1 | 49 |
| 11) Cellulose acetate butyrate | 0.8 | 49.2 |

The suppliers of these binders are, in the respective order, the companies: 1) Hüll [Sic; possibly, Hüls], 2) Rhône-Poulenc, 3) Wacker, 4) Rhône-Poulenc, 5) G.E. Silicone, 6) Dow Chemical, 7) Altulor, 8) and 9) La Celliose 11) Eastman B) Application on substrate (1)

The substrate is a Teflon plate with dimensions 143×76×3 (mm).

Each dispersion was applied by immersion in the dispersion, which led to the formation of wet layer (5) of approximately 30–40 μm.

After drying in air, dry layer (5a) approximately 20 μm thick was obtained. The 5 lateral layers were eliminated, keeping only the layer with dimensions 143 mm×76 mm on the substrate.

C) Dismutation of $Cu_2O$

The 11 plates were dipped in a 10 wt % sulfuric acid solution, for 1 min, and then after rinsing with water, the plates were dried with compressed air.

D) Measurement of the surface resistivity

For this, the four point measurement illustrated in FIG. 4 was used.

The measurement amounts to measuring the voltage ΔV using a voltmeter and intensity I, while the electrical generator imposes a voltage of 100 V.

The values obtained, in Ω/square, are indicated in the table under E).

E) Formation of a copper film (14) by electrolytic deposition as illustrated in FIGS. 5 and 5a.

The electrolysis bath has the composition:

$Cu(BF_4)_2$: 450 g/L $HBF_4$: 40 g/L

Electrolysis conditions:

electrical generator=pulsating current generator temperature of the bath=20°–25° C.

J going from 1 A at the beginning of the electrolysis and reaching 10 A after 3 min. Then, a value of 13 A was maintained for 12 min.

In all cases, one observed the formation of metallic film (14) by progressive propagation and growth of the metallic film from the point of electrical contact. The speed of propagation was roughly the same for all the binders and close to 50 mm/min. This intermediate metallic film (14) has a thickness on the order of 6 μm.

The table which follows indicates the quantity of copper deposited on each sample, the theoretical quantity (deposition of copper on a plane) being 3.376 g, and with the surface resistivity opposite this.

| Binder<br>Chemical nature/Commercial name | Cu<br>quantity<br>(g) | Resistivity<br>$10^6$ Ω/square |
| --- | --- | --- |
| 1) Polymethylphenylsilicone/NH2246 (R) | 3.00 | 21.7 |
| 2) Polymethylphenylsilicone/Rhodorsil 1505 (R) | 2.68 | 15.5 |
| 3) Polymethylphenylsilicone/REN50 (R) | 2.85 | 34.5 |
| 4) Polymethylphenylsilicone/Rhodorsyl 6405 | 3.06 | 29 |
| 5) Silicone/SR125 (R) | 2.93 | 1.7 |
| 6) Silicone/Dow Corning 808 (R) | 2.95 | 1.5 |
| 7) Polymethacrylate/Altuglas (R) | 2.93 | 2.2 |
| 8) Acrylic/Perlucid Re2600 (R) | 2.95 | 23 |
| 9) Epoxide/Duralit R-1516 (R) | 3.17 | 39.5 |
| 10) Polystyrene | 2.77 | 1.1 |
| 11) Cellulose acetate butyrate | 2.90 | 8 |

In conclusion, it is possible to note, on one hand, that there does not seem to be a correlation between the surface resistivity and the quantity of copper deposited, which in all cases, is not far from the theoretical quantity, which shows that all the binders tested are suitable for the implementation of the invention in the case of the substrate which is used.

EXAMPLE 4

The same series of tests as that of Example 3 was done, but using as substrate a plate made of polyurethane foam with dimensions 245×55×10 mm$^3$.

The only differences with respect to Example 3 are the following:

dismutation of $Cu_2O$ in 3 min instead of 1 min as in Example 3;

J going from 2 A at the beginning of the electrolysis and reaching 30 A after 15 min ($\Delta t_s$). Then, a value of 35 A was maintained for 15 min ($\Delta t_E$).

The time (min) necessary for complete covering of the surface (245 mm×55 mm), the fraction (%) of the distance travelled by the metallic film (percentage of covering of the surface of the plate), and the weight (g) of copper deposited were measured.

| Binder<br>Chemical nature/Commercial name | Time<br>(min) | Fraction<br>% | Weight<br>(g) |
| --- | --- | --- | --- |
| 1) Polymethylphenylsilicone/NH42246 (R) | 15 | 100 | 9 |
| 2) Polymethylphenylsilicone/Rhodorsil 1505 (R) | 20 | 100 | 7.6 |
| 3) Polymethylphenylsilicone/REN50 (R) | 14.5 | 100 | 9 |
| 4) Polymethylphenylsilicone/Rhodorsyl 6405 | 17 | 100 | 8.6 |
| 5) Silicone/SR125 (R) | 17 | 100 | 6.8 |
| 6) Silicone/Dow Corning 808 (R) | 17 | 100 | 3.1 |
| 7) Polymethacrylate/Altuglas (R) | — | 61 | 1.3 |
| 8) Acrylic/Perlucid Re2600 (R) | — | 0 | 0 |
| 9) Epoxide/Duralit R-1516 (R) | — | 0 | 0 |
| 10) Polystyrene | — | 53 | 5.7 |
| 11) Cellulose acetate butyrate | — | 32 | 1.1 |

In the case of a substrate made of foam with apparent porosity, this table shows the great selectivity of the test for selecting the binders.

The applicant has issued the hypothesis according to which the lack of propagation of the metallic film would be due to the discontinuity of thin layer (9,9a) containing conductive particles, which discontinuity itself would result from a lesser flexibility of the binder (cracking of the layer during drying of the dispersion?).

It should be noted that in the case of a support with apparent porosity, sections based on the final product have shown the continuity of metallic film (14) over the whole internal surface of the pores and then that of final metallic layer (11).

EXAMPLE 5

A series of tests were run, conducted as in Example 4 and with binder 1), but which differ by the electrolysis conditions with variation of $\Delta t_s$: J went from 2 A at the beginning of electrolysis reaching 30 A after a time $\Delta t_s$. Then, a value of 35 A was maintained for a time $\Delta t_E$ equal to 30 min.

The following results were obtained, which are expressed by the time necessary for complete covering of the foam substrate.

| TESTS | $t_s$<br>(min) | Time for complete<br>covering (min) |
| --- | --- | --- |
| 5a | 0 | No covering |
| 5b | 7 | Partial covering |
| 5c | 8 | 8 |
| 5d | 10 | 10 |
| 5e | 12 | 12 |
| 5f | 15 | 13 |
| 5g | 20 | 15 |
| 5h | 25 | 16 |

For the tests 5c to 5h, the final thickness of metallic layer (11) was close to 50 μm.

These tests show clearly that there is a threshold not to be exceeded for the speed of the rise of current density. In the present case, it is necessary for the speed of the rise to be less than 35 A per 7 min; otherwise, the propagation of the metallic film stops during electrolysis or even does not occur at all, as in test 5a.

It should be noted that from the standpoint of productivity, one should be situated just below this threshold (test 5c).

EXAMPLE 6

A series of tests was run, done as in Example 4 and with binder 1), but which differ by the degree of crosslinking of the binder:

Test 6a=test 4-1 in which dispersion (4) containing said binder, after application on substrate (1) in the form of layer (5), is dried in air in order to form material (20) containing layer (5a).

Test 6b=test 6a, except that layer (5) is dried not at approximately room temperature, but at 130° C. for 4 h.

Test 6c=test 6a, except that layer (5) is dried at 200° C. for 30 min.

Results obtained:

Test 6a is equal to test 4-1, and leads to a uniform deposit of metallic form (14) in 15 min, and then to thick metallic layer (11).

In the case of test 6b, only ⅔ of the foam plate was covered with a metallic deposit, even after 1 h of electrolysis.

In test 6c, no metallic deposit formed even after 1 hour of electrolysis.

These tests confirm the decisive significance of the absence of crosslinking of the binder.

EXAMPLE 7

In test 7a, the conditions of test 6c were reproduced, except that the chosen substrate was a glass plate (120 mm×60 mm×2 mm) instead of being a polyurethane foam plate.

In test 7b, the conditions of test 7a were reproduced, except that after cooking at 200° C., the surface of layer (5a) was abraded before the plate was treated with dilute sulfuric acid in order to bring about dismutation of the $Cu_2O$ powder.

Results:

In test 7a, as in test 6c, no copper deposit forms by electrolysis.

In test 7b, metallic film (14) forms covering the whole of the plate over 120 mm in 8 min ($\Delta t_s$).

These tests confirm the results of the tests of Example 6 and show that it is essential for the binder, by its chemical nature and/or its more or less crosslinked state, not to be capable of withdrawing the particles of $Cu_2O$ from the dismutation action of the sulfuric acid.

Other tests conducted with conductive powders ended with the same conclusions, namely the need to obtain layer (9.9a) containing conductive particles not isolated from the electrolysis bath.

Additional Purposes of the Invention

The invention has, as additional purposes the various products which the process according to the invention allows one to obtain.

These products can be of three types:

a) material (22a) consisting of the combination of insulating substrate (1) and metallic film (14) with a small thickness, typically less than 10 µm, b) composite material (24) consisting of the close combination of insulating substrate (1) and metallic layer (11) with a thickness greater than 10 µm, with it possible for the substrate to be any substrate (plastic film, porous foam, fabric, glass, etc.), c) material (23) essentially consisting of metallic layer (11).

In each of these types of products, metallic layer (11) can include metallic layers of different metals.

Applications of the Invention

The invention has numerous applications, among which it is possible to mention:

the manufacture of thin metallic sheets (sheets of nickel, copper, nickel/copper, etc.);

the manufacturing of supports for catalysts which require a high surface area:volume ratio, by starting, as in Example 4, with a substrate with apparent porosity which itself has a high surface area/volume ratio, and by possibly eliminating the initial substrate after deposition of the metallic layer;

the manufacture of conductive tracks (Cu preferably) which stick to an insulating substrate for instrumentation, for example, for the manufacture of force sensors;

the manufacture of porous structures (with Cu preferably) used for heat exchangers;

the manufacture of porous metallic electrodes for storage batteries, or the manufacture of supports for storage battery electrodes, which can be covered with metals such as cadmium, nickel, copper, etc.;

interference elimination for rigid or flexible nonconductive substrates, antistatic treatment of rigid or flexible nonconductive substrates (including fabrics).

Advantages of the Invention

As already demonstrated, the invention solves numerous problems encountered with the processes of prior art, since the process according to the invention:

a) can be applied, with no known limitations, to any type of support, the treatment according to the invention in a way amounting to applying a "paint" on any insulating substrate (massive object, film, foam, fabrics, etc.);

b) is very flexible, because of the possibility for obtaining a wide range of final products, by combinations of various substrates and metallic layers using roughly the same production tools.

c) is economical in terms of consumable material and in terms of manufacturing costs, allowing for any electrolytic deposition without calling for costly reagents or special treatment steps.

d) is economical in terms of investment, the depositions being carried out by traditional means (without the need for techniques under vacuum and/or at high temperature).

e) is very productive, because of the possibility for forming an electrolytic deposit on a very wide substrate (1 to 2 m) continuously.

We claim:

1. A process for manufacturing a continuous metallic deposit on a non-conducting substrate, comprising:

applying a dispersion on a non-conductive substrate, to form a layer, wherein said dispersion comprises copper oxide, a solvent and a binder;

forming copper from at least part of said copper oxide with a reagent; and depositing on said layer at least one metallic layer by electrolytic deposition in an electrolysis bath;

wherein said binder is selected so that a film of said binder is permeable to said reagent, and said binder is selected from binders that allow progressive formation by electrolytic deposition from a point of electrical contact of a metallic film covering all of a test layer, wherein said test layer is formed by a process comprising (i) applying, on a plate of insulating material 10 cm×20 cm×1 cm, a 25 µm thick layer of a test dispersion comprising, by weight, 50% $Cu_2O$, 10% of said binder and 40% of a test solvent, (ii) eliminating said test solvent at a temperature which is sufficiently low so as not to polymerize or crosslink said binder;

(iii) treating said plate with 10 wt % sulfuric acid for one minute in order to dismutate $Cu_2O$, and then rinsing said plate with water, to form said test layer.

2. A process according to claim 1 in which said copper oxide is either CuO or $Cu_2O$, said reagent being a reducing agent in the case of CuO, and said reagent being either a reducing agent or a dismutation agent in the case of $Cu_2O$.

3. A process according to claim 2 in which said dispersion comprises a fine dispersion of CuO or $Cu_2O$ in the form of particles whose average size is less than 30 µm.

4. A process according to claim 3 in which the CuO or $Cu_2O$ content in said dispersion is between 20 and 80 wt %.

5. A process according to claim 4 in which, said copper oxide is $Cu_2O$ and said reagent is said dismutation agent.

6. A process according to claim 5 in which said dismutating agent is selected from the group consisting of acetic, formic, nitric, oxalic, phosphoric, sulfamic, sulfuric, and tartaric acids.

7. A process according to claim 6 in which $Cu_2O$ is reacted with a salt.

8. A process according to claim 1 in which said solvent is an organic solvents, and said binder is chosen from low-molecular oligomers, prepolymers or polymers with polar groups.

9. A process according to claim 8 in which said binder is chosen from thermoplastic resins or resins which can be heat-hardened before crosslinking.

10. A process according to claim 9 in which said binder is selected from silicone resins.

11. A process according to claim 1 in which said nonconductive substrate is chosen from the group consisting of flat materials molded materials or cellular materials with apparent porosity.

12. A process according to claim 11 in which said substrate is a material in strip form or in formats and in which the steps of said process are performed continuously.

13. A process according to claim 1 further comprising, after the step of forming said metallic layer, separating said metallic layer from said nonconductive substrate.

14. A process according to claim 1 in which, after the step of formation of said metallic layer said metallic layer is not separated from said nonconductive substrate.

15. A process according to claim 1, wherein said layer has a thickness of less than 30 µm.

16. A process according to claim 15, wherein said applying is carried out with a mask so as to obtain after said depositing conductive metallic tracks.

17. A process according to claim 15, further comprising, after said applying, setting said layer by: (a) evaporating said solvent, (b) flocculating said binder, or (c) heating and cooling.

18. A process according to claim 17, wherein said depositing is carried out in two steps comprising:

producing a primary metallic deposit by growth and propagation of a metallic film from at least one point of electrical contact of an electrode and said layer, to form said primary metallic deposit with a thickness of less than 10 µm; and increasing the thickness of said primary metallic film.

19. A process according to claim 18 in which, in a first step, obtaining said primary metallic film by progressively increasing an intensity of an electrolysis current until obtaining a maximum intensity $I_{max}$, and limiting the stirring of said electrolysis bath.

20. A process according to claim 19 in which a progressive increase of intensity ($dI_{max}/dt$) is chosen to be below a limit value beyond which stopping of the growth and of the propagation of said metallic film takes place before the whole of said treated surface is covered with said metallic film.

21. A process according to claim 20 in which said binder has a weight content in said dispersion of less than 20 wt % and is chosen in such a way as 1) to obtain a stable dispersion of said copper oxide 2) to form a continuous thin layer on said substrate, including after partial or total elimination of said solvent, and 3) to keep said thin layer's integrity in said electrolysis bath.

22. A process for manufacturing a continuous metallic deposit on a non-conductive substrate, comprising:

applying a dispersion on a non-conductive substrate, to form a layer, wherein said dispersion comprises an electrically conductive powder, a solvent and a binder; and depositing on said layer a metallic layer by electrolytic reduction of at least one ionic metallic species from solution;

wherein said binder is selected from binders that allow progressive formation by electrolytic deposition from a point of electrical contact of a metallic film covering all of a test layer, wherein said test layer is formed by a process comprising (i) applying, on a plate of insulating material 10 cm×20 cm×1 cm, a 25 µm thick layer of a test dispersion comprising, by weight, 50% $Cu_2O$, 10% of said binder and 40% of a test solvent, (ii) eliminating said test solvent at a temperature which is sufficiently low so as not to polymerize or crosslink said binder;

(iii) treating said plate with 10 wt % sulfuric acid for one minute in order to dismutate $Cu_2O$, and then rinsing said plate with water, to form said test layer.

23. A process according to claim 22 in which said conductive powder is a graphite powder with a particle size of less than 50 µm.

24. A process for manufacturing a continuous metallic deposit on a non-conductive substrate, comprising:

applying a dispersion on a non-conductive substrate, to form a layer, wherein said dispersion comprises copper oxide, a solvent and a binder;

forming copper from at least a portion of said copper oxide with a reagent; and depositing on said layer, without removing said binder, at least one metallic layer by electrolytic deposition;

wherein said binder is selected so that a film of said binder is permeable to said reagent.

25. A process for manufacturing a continuous metallic deposit on a non-conductive substrate, comprising:

applying a dispersion on a non-conductive substrate, to form a layer, wherein said dispersion comprises an electrically conductive powder, a solvent and a binder; and depositing on said layer, without removing said binder, a metallic layer by electrolytic reduction of at least one ionic metallic species from solution.

26. A process according to claim 25, wherein said layer has a resistivity of at least $1.1 \times 10^6$ Ω/square.

* * * * *